(12) United States Patent
Nagumo et al.

(10) Patent No.: US 10,979,096 B2
(45) Date of Patent: Apr. 13, 2021

(54) HIGH-FREQUENCY FRONT-END CIRCUIT

(71) Applicant: Murata Manufacturing Co., Ltd., Nagaokakyo (JP)

(72) Inventors: Shoji Nagumo, Nagaokakyo (JP); Kanta Motoki, Nagaokakyo (JP); Yusaku Muroya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 68 days.

(21) Appl. No.: 16/360,058

(22) Filed: Mar. 21, 2019

(65) Prior Publication Data
US 2019/0222253 A1    Jul. 18, 2019

Related U.S. Application Data

(63) Continuation of application No. PCT/JP2017/034083, filed on Sep. 21, 2017.

(30) Foreign Application Priority Data

Sep. 29, 2016 (JP) .............................. JP2016-190469

(51) Int. Cl.
| | | |
|---|---|---|
| *H04B 1/525* | (2015.01) | |
| *H04B 1/00* | (2006.01) | |
| *H03H 9/72* | (2006.01) | |
| *H04B 1/18* | (2006.01) | |
| *H03H 7/38* | (2006.01) | |

(52) U.S. Cl.
CPC ............... *H04B 1/525* (2013.01); *H03H 7/38* (2013.01); *H03H 9/725* (2013.01); *H04B 1/00* (2013.01); *H04B 1/0057* (2013.01); *H04B 1/18* (2013.01)

(58) Field of Classification Search
None
See application file for complete search history.

(56) References Cited

U.S. PATENT DOCUMENTS

| | | | |
|---|---|---|---|
| 2002/0032038 A1 | 3/2002 | Furutani et al. | |
| 2004/0217914 A1* | 11/2004 | Yamashita ............. | H04B 1/406 343/850 |

(Continued)

FOREIGN PATENT DOCUMENTS

| | | |
|---|---|---|
| JP | 2002-043977 A | 2/2002 |
| WO | 2015079940 A1 | 6/2015 |
| WO | 2016/125619 A1 | 8/2016 |

OTHER PUBLICATIONS

Official Communication issued in International Patent Application No. PCT/JP2017/034083, dated Dec. 5, 2017.

*Primary Examiner* — Saad Khawar
(74) *Attorney, Agent, or Firm* — Keating & Bennett, LLP

(57) ABSTRACT

A high-frequency front-end circuit includes a diplexer, a duplexer, and a low-band-side multiple reflection prevention unit. The diplexer includes an antenna connection terminal, a low-band-side terminal, and a high-band-side terminal, and separates a low-band communication signal and a high-band communication signal. The duplexer separates a transmission signal and a reception signal of the low-band communication signal. The multiple reflection prevention unit is disposed between the low-band-side terminal and the duplexer and reduces or prevents multiple reflections of a leakage signal of the high-band communication signal which leaks to the low band side.

20 Claims, 4 Drawing Sheets

(56) References Cited

U.S. PATENT DOCUMENTS

| | | |
|---|---|---|
| 2016/0268675 A1 | 9/2016 | Onaka et al. |
| 2016/0344100 A1* | 11/2016 | Onaka .................... H01Q 5/335 |
| 2017/0317710 A1* | 11/2017 | Liu ....................... H04B 1/0057 |
| 2017/0332280 A1 | 11/2017 | Kuroda et al. |

* cited by examiner

HIGH-FREQUENCY FRONT-END CIRCUIT

CROSS REFERENCE TO RELATED APPLICATIONS

This application claims the benefit of priority to Japanese Patent Application No. 2016-190469 filed on Sep. 29, 2016 and is a Continuation Application of PCT Application No. PCT/JP2017/034083 filed on Sep. 21, 2017. The entire contents of each of these applications are hereby incorporated herein by reference.

BACKGROUND OF THE INVENTION

1. Field of the Invention

The present invention relates to a high-frequency front-end circuit shared by high-frequency signals in a plurality of communication bands.

2. Description of the Related Art

Various high-frequency front-end circuits are in practical use which transmit and receive high-frequency signals in a plurality of communication bands using a common antenna.

For example, the high-frequency module (high-frequency front-end circuit) disclosed in Japanese Unexamined Patent Application Publication No. 2002-43977 includes a diplexer and a plurality of duplexers. The diplexer includes an antenna terminal, a low-band-side terminal, and a high-band-side terminal. The antenna terminal is connected to an antenna. Between the antenna terminal and the low-band-side terminal, a low pass filter is connected. Between the antenna terminal and the high-band-side terminal, a high pass filter is connected. The diplexer separates a high-frequency signal in a low-side communication band (low-band communication signal) and a high-frequency signal in a high-side communication band (high-band communication signal) from each other.

A first duplexer is connected to the low-band-side terminal of the diplexer and separates the transmission signal and reception signal of a low-band communication signal from each other. A second duplexer is connected to the high-band-side terminal of the diplexer and separates the transmission signal and reception signal of a high-band communication signal from each other.

A system for simultaneously transmitting communication signals in a plurality of communication bands (e.g., specifically, 2UL_CA (2-uplink carrier aggregation)) is proceeding toward practical utilization.

This system simultaneously transmits a transmission signal of a low-band communication signal (a low-band transmission signal) and a transmission signal of a high-band communication signal (a high-band transmission signal) from a common antenna.

Since the power of the transmission signals is high, one of the transmission signals sometimes leaks to the duplexer for the other one of the transmission signals. For example, there is an example in which a high-band transmission signal leaks from the high pass filter to the low pass filter in the diplexer and is transmitted to the low-band duplexer.

Impedance matching for a leakage signal is not performed between the low-band duplexer and the low pass filter in the diplexer. Accordingly, the multiple reflections of a leakage signal are caused by the low-band duplexer and the low pass filter in the diplexer. In a case in which leakage signals are continuously generated, the superimposition of a newly leaked signal and the multiple-reflected signal occurs and the amplitude of a leakage signal that is multiple-reflected between the diplexer and the duplexer becomes large.

A leakage signal whose amplitude has been increased to a certain degree and a low-band transmission signal interfere with each other, so that an IMD (intermodulation distortion) signal is generated. In a case in which the frequency of this IMD signal is close to or at least partially overlaps the frequency of a high-frequency signal that is different from the low-band transmission signal, the transmission characteristic of the high-frequency signal is degraded. For example, in a case in which the frequency of an IMD signal is close to or at least partially overlaps the frequency of a low-band reception signal, the reception sensitivity of the reception signal is degraded.

This problem may arise also in a case in which the low-band transmission signal leaks to the high-band duplexer.

SUMMARY OF THE INVENTION

Preferred embodiments of the present invention provide reduction or prevention of degradation in reception sensitivity caused by excessive occurrence of IMD.

A high-frequency front-end circuit according to a preferred embodiment of the present invention includes a diplexer, a low-band-side duplexer, and a low-band-side multiple reflection prevention unit. The diplexer includes an antenna connection terminal, a low-band-side terminal, and a high-band-side terminal and separates a low-band communication signal and a high-band communication signal from each other. The low-band-side duplexer separates a transmission signal and a reception signal of the low-band communication signal from each other. The multiple reflection prevention unit is disposed between the low-band-side terminal and the low-band-side duplexer and reduces or prevents multiple reflections of a leakage signal of the high-band communication signal which leaks to the low band side.

In this configuration, the low-band-side multiple reflection prevention unit is disposed in a portion between the low-band-side terminal and the low-band-side duplexer at which the multiple reflections of a leakage signal of the high-band communication signal occur. As a result, the occurrence of the multiple reflections of the leakage signal of the high-band communication signal is reduced or prevented.

In a high-frequency front-end circuit according to a preferred embodiment of the present invention, the low-band-side multiple reflection prevention unit preferably includes a peak filter. The peak filter is connected between a transmission line connecting the low-band-side terminal and the low-band-side duplexer and a ground. The peak filter has a filter characteristic in which a frequency band of a transmission signal of the high-band communication signal is a pass band.

In this configuration, a leakage signal flows to the ground via the peak filter. As a result, the occurrence of the multiple reflections of the leakage signal is reduced or prevented. Since the peak filter is not connected in series to a transmission line for the low-band communication signal, the transmission loss of the low-band communication signal is reduced.

A high-frequency front-end circuit according to a preferred embodiment of the present invention preferably has the following configuration. The high-frequency front-end circuit includes a plurality of the low-band-side duplexers and a low-band-side communication band selection circuit. The low-band-side communication band selection circuit is disposed between the low-band-side terminal and the low-band-side duplexers. The low-band-side communication band selection circuit selectively connects the low-band-side terminal to one of the low-band-side duplexers. The low-band-side multiple reflection prevention unit includes a plurality of the peak filters corresponding one-to-one to the low-band-side duplexers and a peak filter selection circuit that selects one of the peak filters. The low-band-side multiple reflection prevention unit is connected between the low-band-side terminal and the low-band-side communication band selection circuit. The low-band-side communication band selection circuit and the peak filter selection circuit are subjected to selection control in a ganged manner.

In this configuration, even if there are a plurality of combinations of communication bands that are affected by multiple reflections, the reduction or prevention of multiple reflections is achieved for each of these combinations.

In a high-frequency front-end circuit according to a preferred embodiment of the present invention, the multiple reflection prevention unit is preferably a band pass filter or a low pass filter that attenuates a transmission signal of the communication signal leaked from the high band side at the time of 2UL_CA (2-uplink carrier aggregation) to reduce or prevent multiple reflections.

In this configuration, the occurrence of multiple reflections is reduced or prevented in a low-band-side circuit at the time of 2UL_CA.

A high-frequency front-end circuit according to a preferred embodiment of the present invention may further include a harmonic prevention filter connected to the low-band-side communication band selection circuit.

In this configuration, the harmonic of a communication signal in a predetermined low communication band is also reduced or prevented.

A high-frequency front-end circuit according to a preferred embodiment of the present invention includes a diplexer, a high-band-side duplexer, and a high-band-side multiple reflection prevention unit. The diplexer includes an antenna connection terminal, a low-band-side terminal, and a high-band-side terminal and separates a low-band communication signal and a high-band communication signal from each other. The high-band-side duplexer separates a transmission signal and a reception signal of the high-band communication signal from each other. The high-band-side multiple reflection prevention unit is disposed between the high-band-side terminal and the high-band-side duplexer. The high-band-side multiple reflection prevention unit reduces or prevents multiple reflection of a leakage signal of the low-band communication signal which leaks to the high band side.

In this configuration, the high-band-side multiple reflection prevention unit is disposed in a portion between the high-band-side terminal and the high-band-side duplexer at which the multiple reflections of a leakage signal of the low-band communication signal occur. As a result, the occurrence of the multiple reflections of the leakage signal of the low-band communication signal is reduced or prevented.

In a high-frequency front-end circuit according to a preferred embodiment of the present invention, the high-band-side multiple reflection prevention unit preferably includes a peak filter. The peak filter is connected between a transmission line connecting the high-band-side terminal and the high-band-side duplexer and a ground. The peak filter has a filter characteristic in which a frequency band of a transmission signal of the low-band communication signal is a pass band.

In this configuration, a leakage signal flows to the ground via the peak filter. As a result, the occurrence of the multiple reflections of the leakage signal is reduced or prevented. Since the peak filter is not connected in series to a transmission line for the high-band communication signal, the transmission loss of the high-band communication signal is reduced.

A high-frequency front-end circuit according to a preferred embodiment of the present invention preferably has the following configuration. The high-frequency front-end circuit includes a plurality of the high-band-side duplexers and a high-band-side communication band selection circuit. The high-band-side communication band selection circuit is disposed between the high-band-side terminal and the high-band-side duplexers. The high-band-side communication band selection circuit selectively connects the high-band-side terminal to one of the high-band-side duplexers. The high-band-side multiple reflection prevention unit includes a plurality of the peak filters corresponding one-to-one to the high-band-side duplexers and a peak filter selection circuit that selects one of the peak filters. The high-band-side multiple reflection prevention unit is connected between the high-band-side terminal and the high-band-side communication band selection circuit. The high-band-side communication band selection circuit and the peak filter selection circuit are subjected to selection control in a ganged manner.

In this configuration, even if there are a plurality of combinations of communication bands that are affected by multiple reflections, the reduction or prevention of multiple reflections is achieved for each of these combinations.

In a high-frequency front-end circuit according to a preferred embodiment of the present invention, the multiple reflection prevention unit preferably includes a band pass filter or a high pass filter that attenuates a transmission signal of the communication signal leaked from the low band side at the time of 2UL_CA (2-uplink carrier aggregation) to reduce or prevent multiple reflections.

In this configuration, the occurrence of multiple reflections is reduced or prevented in a high-band-side circuit at the time of 2UL_CA.

A high-frequency front-end circuit according to a preferred embodiment of the present invention may further include a harmonic prevention filter connected to the high-band-side communication band selection circuit.

In this configuration, the harmonic of a communication signal in a predetermined high communication band is also reduced or prevented.

According to preferred embodiments of the present invention, the multiple reflections of a leakage signal are able to be reduced or prevented and the degradation in reception sensitivity caused by the excessive occurrence of IMD is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the accompanying drawings.

Figure 1:
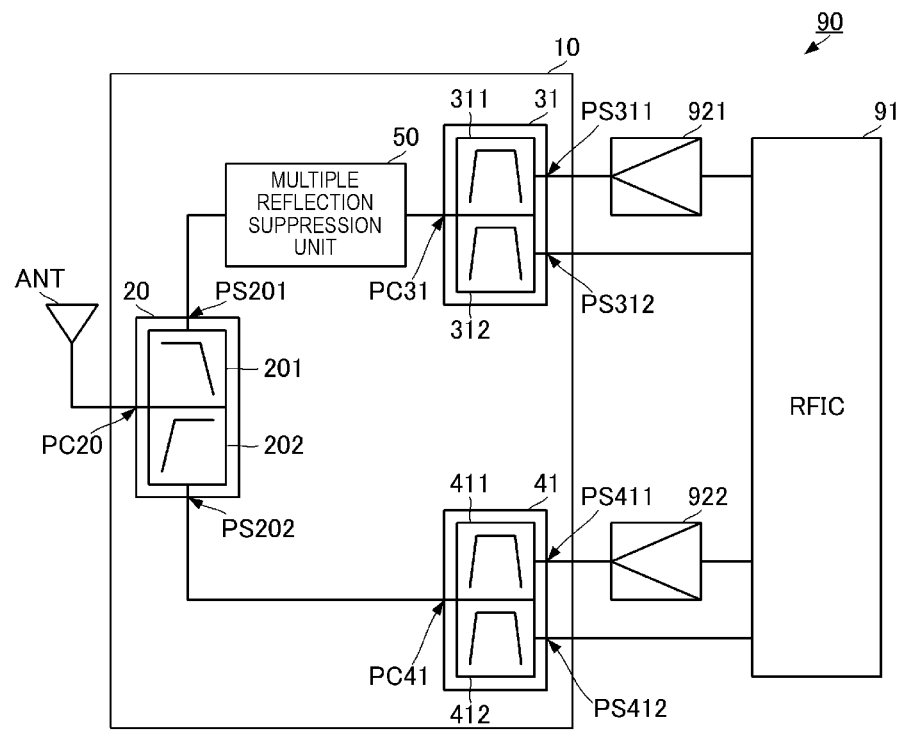
FIG. 1 is a diagram illustrating the circuit configuration of a communication device including a high-frequency front-end circuit according to a first preferred embodiment of the present invention.

A high-frequency front-end circuit according to a first preferred embodiment of the present invention will be described with reference to the accompanying drawings. FIG. 1 is a diagram illustrating the circuit configuration of a communication device including a high-frequency front-end circuit according to the first preferred embodiment of the present invention.

As illustrated in FIG. 1, a high-frequency front-end circuit 10 includes a diplexer 20, duplexers 31 and 41, and a multiple reflection prevention unit 50. The high-frequency front-end circuit 10 is included in a communication device 90. The communication device 90 includes the high-frequency front-end circuit 10, an RFIC 91, PAs (power amplifiers) 921 and 922, and an antenna ANT. The communication device 90 transmits and receives communication signals in respective communication bands preferably for, for example, LTE that is a communication standard. In this case, the high-frequency front-end circuit 10 is configured to support the respective communication bands for LTE.

The diplexer 20 includes a low pass filter 201, a high pass filter 202, an antenna connection terminal PC20, a low-band-side terminal PS201, and a high-band-side terminal PS202. The low pass filter 201 is connected between the antenna connection terminal PC20 and the low-band-side terminal PS201. The high pass filter 202 is connected between the antenna connection terminal PC20 and the high-band-side terminal PS202.

Each of the low pass filter 201 and the high pass filter 202 is preferably defined by, for example, an LC filter circuit including an inductor and a capacitor. The filter characteristics of the low pass filter 201 are set such that the frequency band of a communication signal included in a low band is in a pass band and the frequency band of a communication signal included in a high band is in an attenuation band. The filter characteristics of the high pass filter 202 are set such that the frequency band of a communication signal included in a high band is in a pass band and the frequency band of a communication signal included in a low band is in an attenuation band.

In the present preferred embodiment, the low band and the high band are set based whether a frequency is relatively high or low. For example, in the high-frequency front-end circuit 10 according to the present preferred embodiment, frequencies less than or equal to approximately 900 MHz are preferably set as frequencies in the low band and frequencies greater than or equal to approximately 1500 MHz are preferably set as frequencies in the high band. The setting of the low band and the high band is not limited to this setting and may be performed as appropriate based on a communication system applied to the high-frequency front-end circuit 10 (the communication device 90).

With this configuration, the diplexer 20 transmits a low-band communication signal between the low-band-side terminal PS201 and the antenna connection terminal PC20 with low losses. The diplexer 20 transmits a high-band communication signal between the high-band-side terminal PS202 and the antenna connection terminal PC20 with low losses. Between the low pass filter 201 and the high pass filter 202, predetermined isolation is provided for each of a low-band communication signal and a high-band communication signal.

The duplexer 31 includes a transmission-side filter 311, a reception-side filter 312, a common terminal PC31, a transmission terminal PS311, and a reception terminal PS312. The transmission-side filter 311 is connected between the common terminal PC31 and the transmission terminal PS311. The reception-side filter 312 is connected between the common terminal PC31 and the reception terminal PS312. The common terminal PC31 is connected to the low-band-side terminal PS201 of the diplexer 20 via the multiple reflection prevention unit 50.

Each of the transmission-side filter 311 and the reception-side filter 312 is preferably defined by, for example, a piezoelectric resonator filter (specifically, a SAW filter). The filter characteristics of the transmission-side filter 311 are set such that the frequency band of a transmission signal of a predetermined low-band communication signal is in a pass band and the frequency band of a reception signal of the predetermined communication signal is in an attenuation band. The filter characteristics of the reception-side filter 312 are set such that the frequency band of a reception signal of a predetermined low-band communication signal is in a pass band and the frequency band of a transmission signal of the predetermined communication signal is in an attenuation band.

The duplexer 41 includes a transmission-side filter 411, a reception-side filter 412, a common terminal PC41, a transmission terminal PS411, and a reception terminal PS412. The transmission-side filter 411 is connected between the common terminal PC41 and the transmission terminal PS411. The reception-side filter 412 is connected between the common terminal PC41 and the reception terminal PS412. The common terminal PC41 is connected to the high-band-side terminal PS202 of the diplexer 20.

Each of the transmission-side filter 411 and the reception-side filter 412 is preferably defined by, for example, a piezoelectric resonator filter (specifically, a SAW filter). The filter characteristics of the transmission-side filter 411 are set such that the frequency band of a transmission signal of a predetermined high-band communication signal is in a pass band and the frequency band of a reception signal of the predetermined communication signal is in an attenuation band. The filter characteristics of the reception-side filter 412 are set such that the frequency band of a reception signal of a predetermined high-band communication signal is in a pass band and the frequency band of a transmission signal of the predetermined communication signal is in an attenuation band.

The antenna connection terminal PC20 of the diplexer 20 is connected to the antenna ANT. The transmission terminal PS311 of the duplexer 31 is connected to the output terminal of the PA 921, and the input terminal of the PA 921 is connected to the RFIC 91. The reception terminal PS312 of the duplexer 31 is connected to the RFIC 91. The transmission terminal PS411 of the duplexer 41 is connected to the output terminal of the PA 922, and the input terminal of the PA 922 is connected to the RFIC 91. The reception terminal PS412 of the duplexer 41 is connected to the RFIC 91.

The communication device 90 including the high-frequency front-end circuit 10 having the above-described configuration performs the transmission and reception of a communication signal as will be described below.

(1) In the case of a transmission signal of a first communication signal (a first transmission signal) included in the low band, the RFIC 91 generate the first transmission signal and outputs it to the PA 921. The PA 921 amplifies the first transmission signal and outputs it to the transmission terminal PS311 of the duplexer 31 in the high-frequency front-end circuit 10. The first transmission signal is subjected to filter processing in the transmission-side filter 311 in the duplexer 31 and is input into the low-band-side terminal PS201 of the diplexer 20 via the multiple reflection prevention unit 50. The first transmission signal is subjected to filter processing in the low pass filter 201 and is supplied from the antenna connection terminal PC20 to the antenna ANT.

(2) In the case of a reception signal of the first communication signal (a first reception signal) included in the low band, the first reception signal received by the antenna ANT is input into the antenna connection terminal PC20 of the diplexer 20. The first reception signal is subjected to filter processing in the low pass filter 201 and is output to the low-band-side terminal PS201. The first reception signal is input into the common terminal PC31 of the duplexer 31 via the multiple reflection prevention unit 50. The first reception signal is subjected to filter processing in the reception-side filter 312 and is output to the RFIC 91.

(3) In the case of a transmission signal of a second communication signal (a second transmission signal) included in the high band, the RFIC 91 generates the second transmission signal and outputs it to the PA 922. The PA 922 amplifies the second transmission signal and outputs it to the transmission terminal PS411 of the duplexer 41 in the high-frequency front-end circuit 10. The second transmission signal is subjected to filter processing in the transmission-side filter 411 in the duplexer 41 and is input into the high-band-side terminal PS202 of the diplexer 20. The second transmission signal is subjected to filter processing in the high pass filter 202 and is supplied from the antenna connection terminal PC20 to the antenna ANT.

(4) In the case of a reception signal of the second communication signal (a second reception signal) included in the high band, the second reception signal received by the antenna ANT is input into the antenna connection terminal PC20 of the diplexer 20. The second reception signal is subjected to filter processing in the high pass filter 202 and is output to the high-band-side terminal PS202. The second reception signal is input into the common terminal PC41 of the duplexer 41. The second reception signal is subjected to filter processing in the reception-side filter 412 and is output to the RFIC 91.

In a case in which 2UL_CA (2-uplink carrier aggregation) is performed with this configuration, the first transmission signal and the second transmission signal are simultaneously transmitted. That is, the processing described in cases (1) and (3) above is simultaneously performed. In this case, the second transmission signal sometimes leaks to the side of the low-band circuit and is transmitted to a transmission line connecting the low-band-side terminal PS201 of the diplexer 20 and the common terminal PC31 of the duplexer 31. Impedance matching between the low-band-side terminal PS201 of the diplexer 20 and the common terminal PC31 of the duplexer 31 is not usually performed for the frequency band of the second transmission signal. Accordingly, as described above, the multiple reflections of a leakage signal occur between the low-band-side terminal PS201 of the diplexer 20 and the common terminal PC31 of the duplexer 31.

In the high-frequency front-end circuit 10, the multiple reflection prevention unit 50 is connected between the low-band-side terminal PS201 of the diplexer 20 and the common terminal PC31 of the duplexer 31.

The multiple reflection prevention unit 50 has a transmission characteristic in which the amount of attenuation in the frequency band of a leakage signal (the frequency band of the second transmission signal in the present preferred embodiment) is large and the amount of attenuation of low-band communication signals including the first transmission signal is small. As a result, the multiple reflections of a leakage signal are reduced or prevented.

Figure 2:
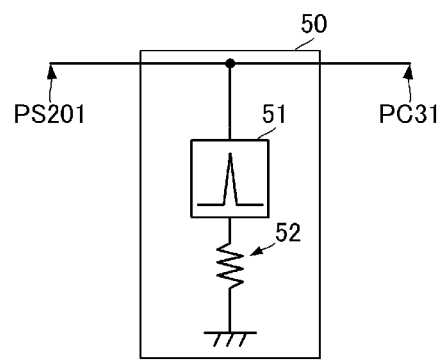
FIG. 2 is a circuit diagram of a multiple reflection prevention unit according to the first preferred embodiment of the present invention.

FIG. 2 is a circuit diagram of a multiple reflection prevention unit according to the first preferred embodiment of the present invention. As illustrated in FIG. 2, the multiple reflection prevention unit 50 includes a peak filter 51 and a resistor 52. The peak filter 51 has a filter characteristic in which attenuation rarely occurs in the frequency band of a leakage signal and the amount of attenuation is large in a frequency band different from the frequency band of a leakage signal. That is, the peak filter 51 is configured based on a concept contrary to the concept of a notch filter.

The peak filter 51 is connected between a transmission line connecting the low-band-side terminal PS201 and the common terminal PC31 and the ground. The resistor 52 is connected to the ground-side end portion of the peak filter 51. The resistor 52 is used to match with the ground, and may be omitted.

Figure 3:
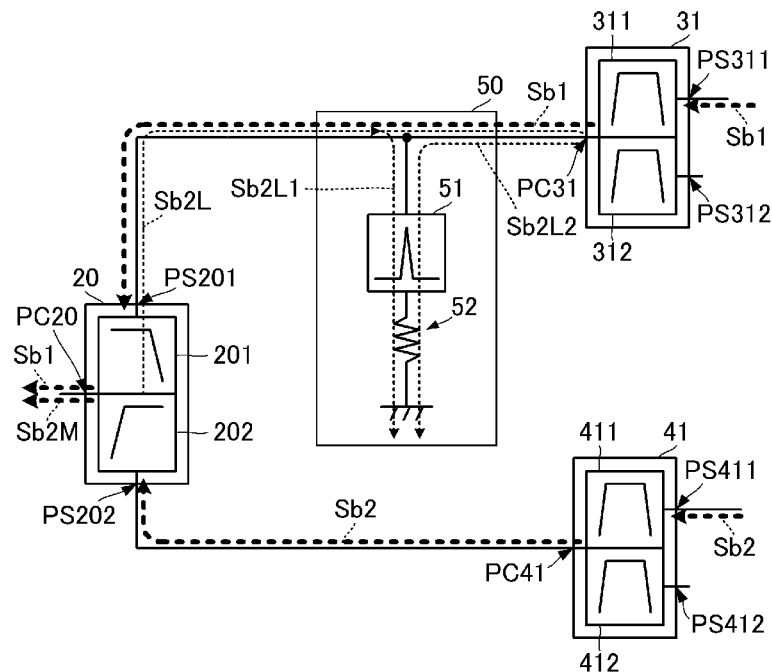
FIG. 3 is a diagram describing a multiple reflection reduction or prevention concept.

Using the multiple reflection prevention unit 50 having the above-described configuration, the occurrence of multiple reflections is reduced or prevented as will be described below. FIG. 3 is a diagram describing a multiple reflection reduction or prevention concept. In FIG. 3, Sb1 represents a first transmission signal and Sb2 represents a second transmission signal. The first transmission signal Sb1 is a low-band transmission signal and the second transmission signal Sb2 is a high-band transmission signal. Sb2L represents a leakage signal of the second transmission signal Sb2, Sb2L1 represents a leakage signal directly transmitted to the side of the peak filter 51, and Sb2L2 represents a leakage signal that is reflected by the common terminal PC31 of the duplexer 31 and is transmitted to the side of the peak filter 51.

The high-band second transmission signal Sb2 and the low-band first transmission signal Sb1 are continuously transmitted at the same time. The first transmission signal Sb1 is output to the antenna ANT (not illustrated in FIG. 3) via the duplexer 31 and the diplexer 20. The second transmission signal Sb2 is output to the antenna ANT (not illustrated in FIG. 3) via the duplexer 41 and the diplexer 20.

A portion of the second transmission signal Sb2 leaks to the side of the duplexer 31 over the isolation between the high pass filter 202 and the low pass filter 201 in the diplexer 20. This amount of attenuation is typically very small. However, in a case in which leakage continuously occurs and the superimposition of leakage signals due to multiple reflections occurs as described above, that is a problem.

By providing the multiple reflection prevention unit 50, the impedance for the leakage signal Sb2L is matched (is brought into conduction) when the ground is viewed from the transmission line connecting the low-band-side terminal PS201 and the common terminal PC31 and the signal Sb2L1, which is a portion of the leakage signal Sb2L, flows to the ground. The signal Sb2L2 that is another portion of the leakage signal Sb2L and is reflected by the common terminal PC31 similarly flows to the ground.

Thus, by providing the multiple reflection prevention unit 50, the leakage signal Sb2L flows to the ground and the occurrence of multiple reflections is reduced or prevented. As a result, the occurrence of intermodulation distortion (IMD) caused by a multiple reflection signal based on a leakage signal and the first transmission signal Sb1 is reduced or prevented and the occurrence of characteristic degradation due to the intermodulation distortion is reduced or prevented. For example, the decrease in low-band-side reception sensitivity is reduced or prevented.

Since a circuit element is not connected to the transmission line connecting the low-band-side terminal PS201 and the common terminal PC31 in the multiple reflection prevention unit 50, the transmission loss of a low-band-side communication signal is able to be reduced.

Although an exemplary case in which the second transmission signal Sb2 leaks to the low band side via the diplexer 20 has been described with reference to FIG. 3, a leakage path is not limited to this path. For example, in a case in which the transmission line connecting the low-band-side terminal PS201 and the common terminal PC31 and the transmission line connecting the high-band-side terminal PS202 and the common terminal PC41 are close to each other in the state of the circuit modules defining the high-frequency front-end circuit 10, similar leakage may occur. In such a case, the occurrence of multiple reflections is also able to be reduced or prevented.

Figure 4:
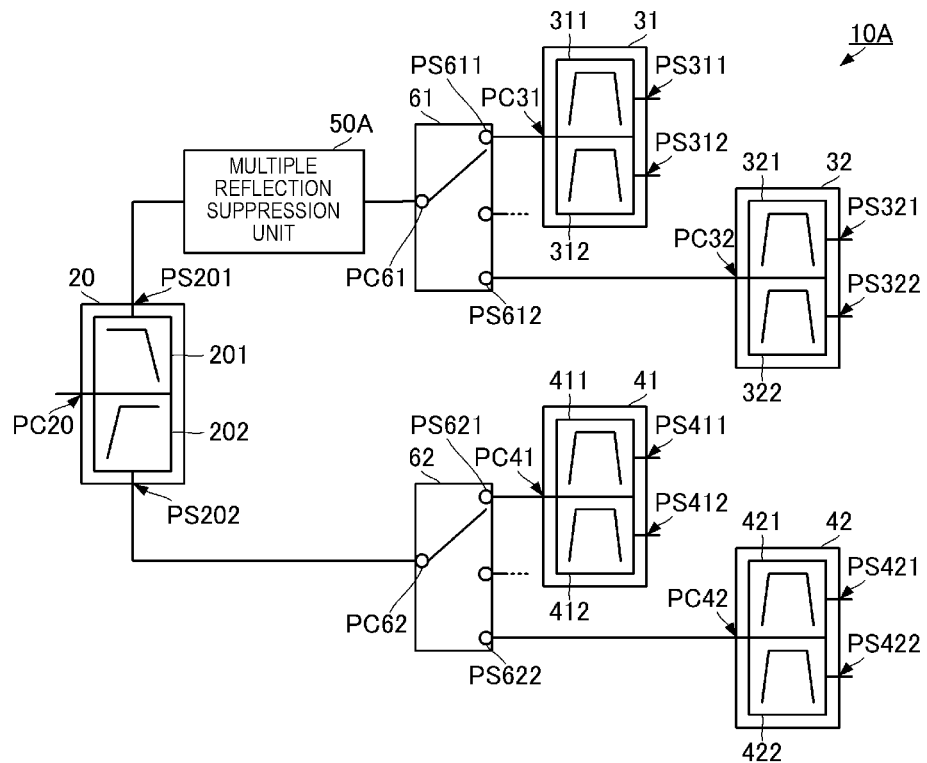
FIG. 4 is a diagram illustrating the circuit configuration of a high-frequency front-end circuit according to a second preferred embodiment of the present invention.

Next, a high-frequency front-end circuit according to a second preferred embodiment of the present invention will be described with reference to the accompanying drawing. FIG. 4 is a diagram illustrating the circuit configuration of a high-frequency front-end circuit according to the second preferred embodiment of the present invention.

As illustrated in FIG. 4, a high-frequency front-end circuit 10A according to the present preferred embodiment is able to support a case in which there are a plurality of low-band communication signals and a plurality of high-band communication signals. The basic circuit configuration of the high-frequency front-end circuit 10A is the same or substantially the same as that of the high-frequency front-end circuit 10 according to the first preferred embodiment.

The high-frequency front-end circuit 10A includes the diplexer 20, the duplexers 31 and 41, duplexers 32 and 42, a multiple reflection prevention unit 50A, and switch circuits 61 and 62. The diplexer 20 and the duplexers 31 and 41 are the same or substantially the same as the diplexer 20 and the duplexers 31 and 41 in the first preferred embodiment, respectively. Each of the switch circuits 61 and 62 corresponds to a "communication band selection circuit".

The duplexer 32 includes a transmission-side filter 321, a reception-side filter 322, a common terminal PC32, a transmission terminal PS321, and a reception terminal PS322. The transmission-side filter 321 is connected between the common terminal PC32 and the transmission terminal PS321. The reception-side filter 322 is connected between the common terminal PC32 and the reception terminal PS322. The filter characteristics (such as the frequencies in the pass band) of the transmission-side filter 321 differ from those (such as the frequencies in the pass band) of the transmission-side filter 311 in the duplexer 31. The filter characteristics (such as the frequencies in the pass band) of the reception-side filter 322 differ from that (such as the frequencies in the pass band) of the reception-side filter 312 in the duplexer 31. Thus, the duplexers 32 and 31 perform filter processing upon different communication signals (communication bands) in the low band. For example, the duplexer 31 is set for a first communication signal in the low band and the duplexer 32 is set for a third communication signal different from the first communication signal.

The switch circuit 61 includes a switch common terminal PC61 and selection terminals PS611 and PS612. The number of selection terminals does not necessarily have to be two. A plurality of selection terminals including the selection terminals PS611 and PS612 are selectively connected to the switch common terminal PC61.

The switch common terminal PC61 in the switch circuit 61 is connected to the low-band-side terminal PS201 of the diplexer 20 via the multiple reflection prevention unit 50A. The selection terminal PS611 in the switch circuit 61 is connected to the common terminal PC31 of the duplexer 31, and the selection terminal PS612 is connected to the common terminal PC32 of the duplexer 32.

The duplexer 42 includes a transmission-side filter 421, a reception-side filter 422, a common terminal PC42, a transmission terminal PS421, and a reception terminal PS422. The transmission-side filter 421 is connected between the common terminal PC42 and the transmission terminal PS421. The reception terminal PS422 is connected between the common terminal PC42 and the reception terminal PS422. The filter characteristics (such as the frequencies in the pass band) of the transmission-side filter 421 differ from those (such as the frequencies in the pass band) of the transmission-side filter 411 in the duplexer 41. The filter characteristics (such as the frequencies in the pass band) of the reception-side filter 422 differ from that (such as the frequencies in the pass band) of the reception-side filter 412 in the duplexer 41. Thus, the duplexers 42 and 41 perform filter processing upon different communication signals (communication bands) in the high band. For example, the duplexer 41 is set for a second communication signal in the high band and the duplexer 42 is set for a fourth communication signal different from the second communication signal.

The switch circuit 62 includes a switch common terminal PC62 and selection terminals PS621 and PS622. The number of selection terminals does not necessarily have to be two. A plurality of selection terminals including the selection terminals PS621 and PS622 are selectively connected to the switch common terminal PC62.

The switch common terminal PC62 in the switch circuit 62 is connected to the high-band-side terminal PS202 of the diplexer 20. The selection terminal PS621 in the switch circuit 62 is connected to the common terminal PC41 of the duplexer 41, and the selection terminal PS622 is connected to the common terminal PC42 of the duplexer 42.

Figure 5:
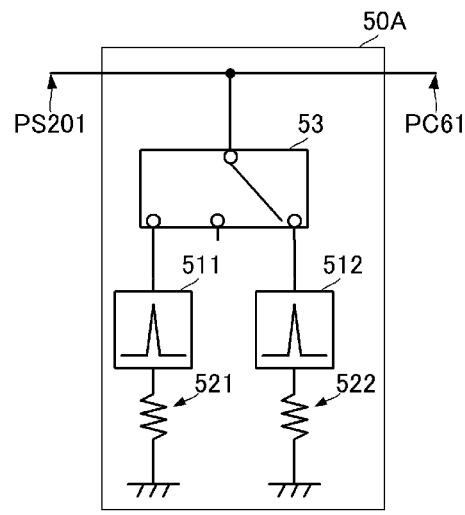
FIG. 5 is a circuit diagram of a multiple reflection prevention unit according to the second preferred embodiment of the present invention.

FIG. 5 is a circuit diagram of a multiple reflection prevention unit according to the second preferred embodiment of the present invention. As illustrated in FIG. 5, the multiple reflection prevention unit 50A includes peak filters 511 and 512, resistors 521 and 522, and a switch circuit 53. The switch circuit 53 corresponds to a "peak filter selection circuit".

The peak filter 511 is the same or substantially the same as the peak filter 511 in the first preferred embodiment, and has a filter characteristic in which the amount of attenuation is small in a narrow frequency band including the frequency band of the transmission signal of the second communication signal (second transmission signal) and is large in the other frequency band. The peak filter 512 has a filter characteristic in which the amount of attenuation is small in a narrow frequency band including the frequency band of the transmission signal of the fourth communication signal (fourth transmission signal) and is large in the other frequency band. Thus, the peak filters 511 and 512 have different filter characteristics corresponding to communication signals to be processed.

The resistor 521 is used to match impedance for the first transmission signal, and is connected between the peak filter 511 and the ground. The resistor 522 is used to match impedance for the third transmission signal, and is connected between the peak filter 512 and the ground.

The switch circuit 53 selectively connects one of the peak filters 511 and 512 to the transmission line connecting the low-band-side terminal PS201 and the switch common terminal PC61.

In a case in which the low-band first communication signal is transmitted and received with this configuration, the switch common terminal PC61 is connected to the selection terminal PS611 in the switch circuit 61. At that time, the switch circuit 53 connects the peak filter 511 to the transmission line.

On the other hand, in a case in which the low-band third communication signal is transmitted and received, the switch common terminal PC61 is connected to the selection terminal PS612 in the switch circuit 61. At that time, the switch circuit 53 connects the peak filter 512 to the transmission line.

Thus, the switch circuits 61 and 53 are subjected to switch control in a ganged manner in accordance with a communication signal to be transmitted or received.

In a case in which the high-band second communication signal is transmitted and received, the switch common terminal PC62 is connected to the selection terminal PS621 in the switch circuit 62. In a case in which the high-band fourth communication signal is transmitted and received, the switch common terminal PC62 is connected to the selection terminal PS622 in the switch circuit 62.

In a case in which the second transmission signal (the transmission signal of the second communication signal) that causes IMD along with the first transmission signal is transmitted on the high band side when the first transmission signal (the transmission signal of the first communication signal) is transmitted, the peak filter 511 in the above-described configuration reduces or prevents the occurrence of multiple reflections.

In a case in which the fourth transmission signal (the transmission signal of the fourth communication signal) that causes IMD along with the third transmission signal is transmitted on the high band side when the third transmission signal (the transmission signal of the third communication signal) is transmitted, the peak filter 512 reduces or prevents the occurrence of multiple reflections.

Thus, even if there are a plurality of combinations of a low-band-side transmission signal and a high-band-side transmission signal which cause IMD having an adverse effect on the characteristics of the high-frequency front-end circuit 10A, the occurrence of the multiple reflections of a leakage signal is reduced or prevented and the occurrence of IMD is reduced or prevented in each of the combinations using a configuration according to the present preferred embodiment.

Although two types of combinations (the combinations of a high-band transmission signal and a low-band transmission signal) are supported in the present preferred embodiment, three or more types of combinations are also able to be supported. In this case, the number of types of peak filters is set to the same as the number of types of combinations.

Figure 6:
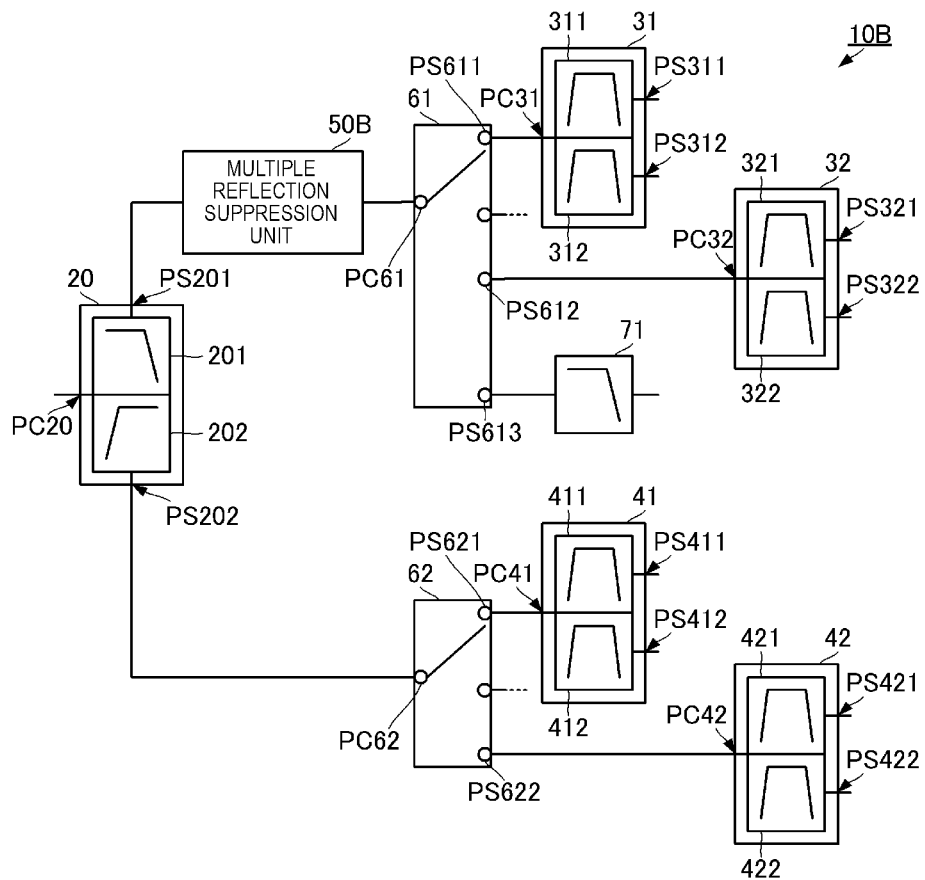
FIG. 6 is a diagram illustrating the circuit configuration of a high-frequency front-end circuit according to a third preferred embodiment of the present invention.

Next, a high-frequency front-end circuit according to a third preferred embodiment of the present invention will be described with reference to the accompanying drawing. FIG. 6 is a diagram illustrating the circuit configuration of a high-frequency front-end circuit according to the third preferred embodiment of the present invention.

As illustrated in FIG. 6, a high-frequency front-end circuit 10B according to the present preferred embodiment differs from the high-frequency front-end circuit 10A according to the second preferred embodiment in that a harmonic prevention filter 71 is provided on the low band side. The remaining configuration of the high-frequency front-end circuit 10B is the same or substantially the same as that of the high-frequency front-end circuit 10A, and the description thereof will be omitted.

The switch circuit 61 includes a selection terminal PS613. The selection terminal PS613 is selectively connected to the switch common terminal PC61. The harmonic prevention filter 71 is connected to the selection terminal PS613. The harmonic prevention filter 71 is connected to the output terminal of a PA (not illustrated) for the transmission signal of a fifth communication signal (fifth transmission signal) different from the first and third communication signals. The harmonic prevention filter 71 attenuates the harmonic content of the fifth transmission signal. The fifth communication signal is preferably, for example, a communication signal for GSM® (global system for mobile communications).

Thus, not only in a high-frequency front-end circuit that supports a communication signal for the LTE (long term evolution) standard but also in the high-frequency front-end circuit 10B that performs transmission and reception in compliance with, GSM®, the occurrence of multiple reflections of a leakage signal are able to be reduced or prevented.

Figure 7:
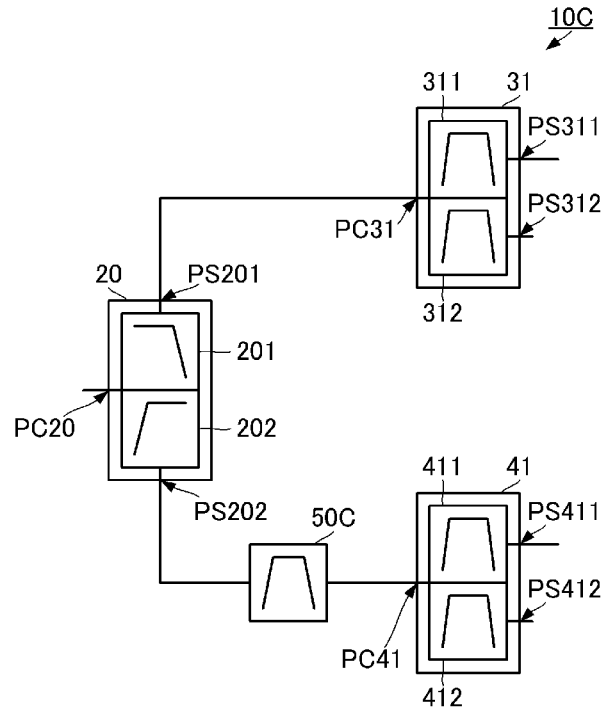
FIG. 7 is a diagram illustrating the circuit configuration of a high-frequency front-end circuit according to a fourth preferred embodiment of the present invention.

Next, a high-frequency front-end circuit according to a fourth preferred embodiment of the present invention will be described with reference to the accompanying drawing. FIG. 7 is a diagram illustrating the circuit configuration of a high-frequency front-end circuit according to the fourth preferred embodiment of the present invention.

As illustrated in FIG. 7, a high-frequency front-end circuit 10C according to the present preferred embodiment differs from the high-frequency front-end circuit 10 according to the first preferred embodiment in that the multiple reflection prevention unit 50 is not provided and a multiple reflection prevention unit 50C is provided. The remaining configuration of the high-frequency front-end circuit 10C is the same or substantially the same as that of the high-frequency front-end circuit 10 according to the first preferred embodiment, and the description thereof will be omitted.

The high-frequency front-end circuit 10C includes the diplexer 20, the duplexers 31 and 41, and the multiple reflection prevention unit 50C.

The low-band-side terminal PS201 of the diplexer 20 is connected to the common terminal PC31 of the duplexer 31.

The high-band-side terminal PS202 of the diplexer 20 is connected to the common terminal PC41 of the duplexer 41 via the multiple reflection prevention unit 50C. That is, the multiple reflection prevention unit 50C is connected between the high-band-side terminal PS202 and the common terminal PC41.

The multiple reflection prevention unit 50C is defined by a band pass filter. The filter characteristics of the multiple reflection prevention unit 50C are that the frequency band of the transmission signal of a low-band-side communication signal is in an attenuation band and the frequency band of a high-band-side communication signal is in a pass band.

Even if a portion of the low-band-side communication signal leaks to the high band side, the multiple reflection prevention unit 50C in the above-described configuration reduces or prevents a leakage signal. Accordingly, the occurrence of the multiple reflections of a leakage signal is reduced or prevented and the adverse effect of IMD on a characteristic is reduced or prevented.

The multiple reflection prevention unit 50C is defined by a band pass filter in the present preferred embodiment, but may have the same or substantially the same circuit configuration as the multiple reflection prevention unit 50.

Figure 8:
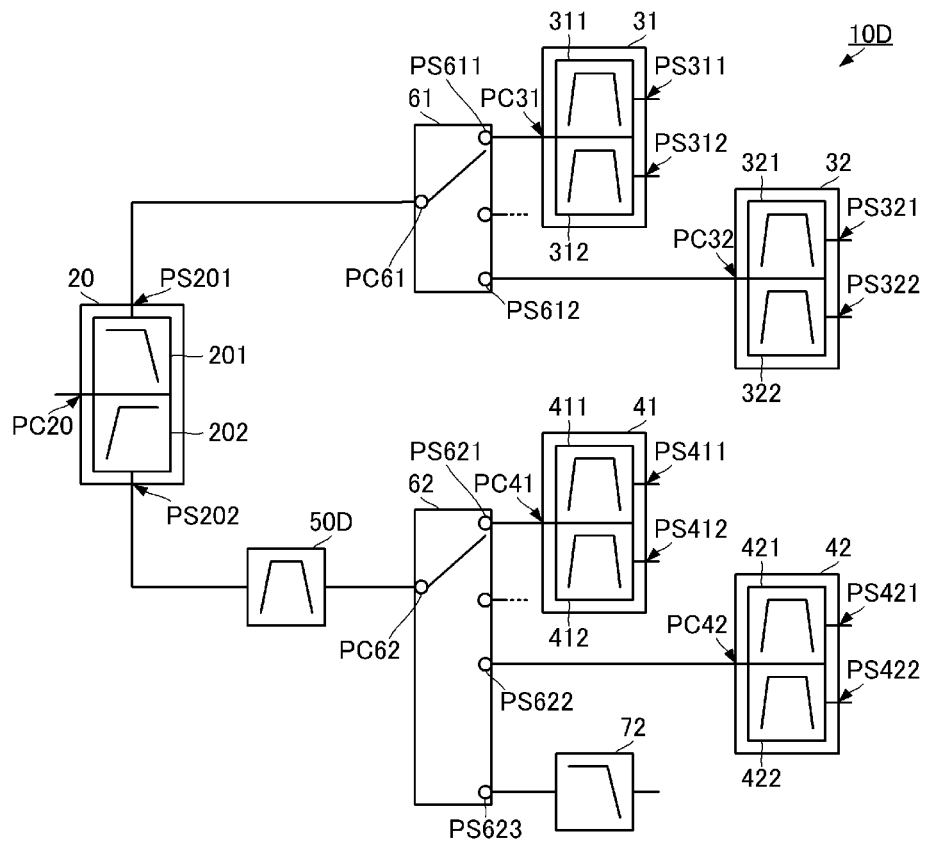
FIG. 8 is a diagram illustrating the circuit configuration of a high-frequency front-end circuit according to a fifth preferred embodiment of the present invention.

Next, a high-frequency front-end circuit according to a fifth preferred embodiment of the present invention will be described with reference to the accompanying drawing. FIG. 8 is a diagram illustrating the circuit configuration of a high-frequency front-end circuit according to the fifth preferred embodiment of the present invention.

As illustrated in FIG. 8, a high-frequency front-end circuit 10D according to the present preferred embodiment differs from the high-frequency front-end circuit 10B according to the third preferred embodiment in that the multiple reflection prevention unit 50B is not provided and a multiple reflection prevention unit 50D and a harmonic prevention filter 72 are provided. The remaining configuration of the high-frequency front-end circuit 10D is the same or substantially the same as that of the high-frequency front-end circuit 10 according to the first preferred embodiment, and the description thereof will be omitted. The illustration of the harmonic prevention filter 71 is omitted.

The high-frequency front-end circuit 10D includes the diplexer 20, the duplexers 31, 32, 41, and 42, the multiple reflection prevention unit 50D, the switch circuits 61 and 62, and the harmonic prevention filter 72.

The low-band-side terminal PS201 of the diplexer 20 is connected to the switch common terminal PC61 in the switch circuit 61.

The high-band-side terminal PS202 of the diplexer 20 is connected to the switch common terminal PC62 in the switch circuit 62 via the multiple reflection prevention unit 50D. That is, the multiple reflection prevention unit 50D is connected between the high-band-side terminal PS202 and the switch common terminal PC62.

The multiple reflection prevention unit 50D is preferably defined by a band pass filter. The filter characteristics of the multiple reflection prevention unit 50D are that the frequency bands of the transmission signals of a plurality of low-band-side communication signals are in an attenuation band and the frequency bands of a plurality of high-band-side communication signals are in a pass band. The filter characteristics of the multiple reflection prevention unit 50D may be set such that the frequency bands of at least communication signals among the low-band-side communication signals with which adverse effects may arise from IMD are in the attenuation band.

The switch circuit 62 includes a selection terminal PS623. The selection terminal PS623 is selectively connected to the switch common terminal PC62. The harmonic prevention filter 72 is connected to the selection terminal PS623. The harmonic prevention filter 72 is connected to the output terminal of a PA (not illustrated) for the transmission signal of a sixth communication signal (sixth transmission signal) different from the second and fourth communication signals. The harmonic prevention filter 72 attenuates the harmonic content of the sixth transmission signal. The sixth communication signal is preferably, for example, a communication signal for DCS®. The harmonic prevention filter 72 is used as a countermeasure against the harmonic of the sixth communication signal. However, the harmonic prevention filter 72 does not necessarily have to be provided and the multiple reflection prevention unit 50D may provide the function of the harmonic prevention filter 72.

Even if a portion of one of a plurality of low-band-side transmission signals leaks to the high band side, the multiple reflection prevention unit 50D in the above-described configuration reduces or prevents the occurrence of the multiple reflections of a leakage signal. Accordingly, the occurrence of the multiple reflections of a leakage signal is reduced or prevented and the adverse effect of IMD on a characteristic is reduced or prevented.

The respective configurations described in the preferred embodiments may be combined as appropriate. That is, multiple reflection prevention units may be disposed on both of the low band side and the high band side.

The multiple reflection prevention unit disposed on the low band side may be defined by, for example, a band pass filter. In a case in which the multiple reflection prevention unit disposed on the low band side is defined by a band pass filter, the low-band-side multiple reflection prevention unit may also provide the function of the harmonic prevention filter 71 and the harmonic prevention filter 71 may be omitted.

The multiple reflection prevention unit disposed on the low band side may be defined by a low pass filter. In a case in which the multiple reflection prevention unit disposed on the low band side is defined by a low pass filter, the low-band-side multiple reflection prevention unit may also provide the function of the harmonic prevention filter 71 and the harmonic prevention filter 71 may be omitted.

The multiple reflection prevention unit disposed on the high band side may be defined by a high pass filter.

In the above description, duplexers are provided on both of the low band side and the high band side. However, even if a duplexer is not provided in a circuit on a band side opposite to a band side to which a multiple reflection prevention unit is connected, the above-described advantageous operational effects are able to be obtained on the condition that a transmission line for a transmission signal is provided in the circuit on the opposite band side.

In the case of the LTE communication standard, the combinations with which adverse effects may arise from IMD are, for example, as follows. In the case of the combination of Band3 and Band5, the fourth-order IMD affects Band3. In the case of Band4 and Band5, the second-order IMD affects Band5. In the case of Band5 and Band7, the third-order IMD affects Band5. In the case of the combination of Band7 and Band20, the third-order IMD affects Band20. The combination of communication bands is not limited to these combinations. In a case in which a frequency at which intermodulation distortion is caused by a transmission signal in a predetermined low communication band and a transmission signal in a predetermined high communication band is close to or at least partially overlaps the frequency band of the predetermined low communication band or the predetermined high communication band, a configuration according to preferred embodiments of the present invention is able to be applied to obtain the effect of reducing or preventing the occurrence of multiple reflections.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency front-end circuit comprising:
a diplexer that includes an antenna connection terminal, a low-band-side terminal, and a high-band-side terminal, and that separates a low-band communication signal and a high-band communication signal from each other;
a low-band-side duplexer that separates a transmission signal and a reception signal of the low-band communication signal from each other; and
a low-band-side multiple reflection prevention unit that is disposed between the low-band-side terminal and the low-band-side duplexer and that reduces or prevents multiple reflections of a leakage signal of the high-band communication signal which leaks to the low band side; wherein
the low-band-side multiple reflection prevention unit is connected between a transmission line connecting the low-band-side terminal and the low-band-side duplexer and a ground.

2. The high-frequency front-end circuit according to claim 1, wherein the low-band-side multiple reflection prevention unit includes a peak filter having a pass band in which a frequency band of a transmission signal of the high-band communication signal is present.

3. The high-frequency front-end circuit according to claim 2, wherein
the high-frequency front-end circuit includes a plurality of the low-band-side duplexers and a low-band-side communication band selection circuit disposed between the low-band-side terminal and the plurality of low-band-side duplexers, and that selectively connects the low-band-side terminal to one of the plurality of low-band-side duplexers;
the low-band-side multiple reflection prevention unit includes a plurality of the peak filters corresponding one-to-one to the plurality of low-band-side duplexers and a peak filter selection circuit that selects one of the plurality of peak filters;
the low-band-side multiple reflection prevention unit is connected between the low-band-side terminal and the low-band-side communication band selection circuit; and
the low-band-side communication band selection circuit and the peak filter selection circuit are subjected to selection control in a ganged manner.

4. The high-frequency front-end circuit according to claim 3, further comprising a harmonic prevention filter connected to the low-band-side communication band selection circuit.

5. The high-frequency front-end circuit according to claim 1, wherein the multiple reflection prevention unit is a band pass filter or a low pass filter that attenuates a transmission signal of the communication signal leaked from the high band side during 2-uplink carrier aggregation to reduce or prevent multiple reflections.

6. The high-frequency front-end circuit according to claim 1, wherein
the diplexer further includes a low pass filter and a high pass filter;
the low pass filter is connected between the antenna connection terminal and the low-band-side terminal; and
the high pass filter is connected between the antenna connection terminal and the high-band-side terminal.

7. The high-frequency front-end circuit according to claim 6, wherein each of the low pass filter and the high pass filter is defined by an LC filter circuit including an inductor and a capacitor.

8. The high-frequency front-end circuit according to claim 6, wherein filter characteristics of the low pass filter are set such that a frequency band of a communication signal included in a low band is in a pass band and a frequency band of a communication signal included in a high band is in an attenuation band.

9. The high-frequency front-end circuit according to claim 8, wherein the low band includes frequencies less than or equal to 900 MHz, and the high band includes frequencies greater than or equal to 1500 MHz.

10. The high-frequency front-end circuit according to claim 6, wherein filter characteristics of the high pass filter are set such that a frequency band of a communication signal included in a high band is in a pass band and a frequency band of a communication signal included in a low band is in an attenuation band.

11. A high-frequency front-end circuit comprising:
a diplexer that includes an antenna connection terminal, a low-band-side terminal, and a high-band-side terminal, and that separates a low-band communication signal and a high-band communication signal from each other;
a high-band-side duplexer that separates a transmission signal and a reception signal of the high-band communication signal from each other; and
a high-band-side multiple reflection prevention unit disposed between the high-band-side terminal and the high-band-side duplexer and reduces or prevents multiple reflections of a leakage signal of the low-band communication signal which leaks to the high band side.

12. The high-frequency front-end circuit according to claim 11, wherein the high-band-side multiple reflection prevention unit is connected between a transmission line connecting the high-band-side terminal and the high-band-side duplexer and a ground, and includes a peak filter having a pass band in which a frequency band of a transmission signal of the low-band communication signal is present.

13. The high-frequency front-end circuit according to claim 12, wherein
the high-frequency front-end circuit includes a plurality of the high-band-side duplexers and a high-band-side communication band selection circuit disposed between the high-band-side terminal and the plurality of high-band-side duplexers and that selectively connects the high-band-side terminal to one of the plurality of high-band-side duplexers;
the high-band-side multiple reflection prevention unit includes a plurality of the peak filters corresponding one-to-one to the plurality of high-band-side duplexers and a peak filter selection circuit that selects one of the plurality of peak filters;

the high-band-side multiple reflection prevention unit is connected between the high-band-side terminal and the high-band-side communication band selection circuit; and the high-band-side communication band selection circuit and the peak filter selection circuit are subjected to selection control in a ganged manner.

14. The high-frequency front-end circuit according to claim 13, further comprising a harmonic prevention filter connected to the high-band-side communication band selection circuit.

15. The high-frequency front-end circuit according to claim 11, wherein the multiple reflection prevention unit includes a band pass filter or a high pass filter that attenuates a transmission signal of the communication signal leaked from the low band side during 2-uplink carrier aggregation to reduce or prevent multiple reflections.

16. The high-frequency front-end circuit according to claim 11, wherein the diplexer further includes a low pass filter and a high pass filter;

the low pass filter is connected between the antenna connection terminal and the low-band-side terminal; and the high pass filter is connected between the antenna connection terminal and the high-band-side terminal.

17. The high-frequency front-end circuit according to claim 16, wherein each of the low pass filter and the high pass filter is defined by an LC filter circuit including an inductor and a capacitor.

18. The high-frequency front-end circuit according to claim 16, wherein filter characteristics of the low pass filter are set such that a frequency band of a communication signal included in a low band is in a pass band and a frequency band of a communication signal included in a high band is in an attenuation band.

19. The high-frequency front-end circuit according to claim 18, wherein the low band includes frequencies less than or equal to 900 MHz, and the high band includes frequencies greater than or equal to 1500 MHz.

20. The high-frequency front-end circuit according to claim 16, wherein filter characteristics of the high pass filter are set such that a frequency band of a communication signal included in a high band is in a pass band and a frequency band of a communication signal included in a low band is in an attenuation band.

* * * * *